United States Patent
Toso et al.

(10) Patent No.: US 9,490,745 B1
(45) Date of Patent: Nov. 8, 2016

(54) VOLTAGE-CONTROLLED OSCILLATOR

(71) Applicant: Marvell International Ltd., Hamilton (BM)

(72) Inventors: Stefano Dal Toso, Milan (IT); Rinaldo Castello, Arcore (IT); Marco Garampazzi, Casorate Primo (IT); Paulo Mateus Mendes, Braga (PT); Nicola Codega, Colorina (IT); Danilo Manstretta, Stradella (IT)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/602,081

(22) Filed: Jan. 21, 2015

Related U.S. Application Data

(60) Provisional application No. 61/929,812, filed on Jan. 21, 2014.

(51) Int. Cl.
*H03B 5/12* (2006.01)

(52) U.S. Cl.
CPC .......... *H03B 5/1296* (2013.01); *H03B 5/1212* (2013.01); *H03B 5/1215* (2013.01); *H03B 2200/0054* (2013.01); *H03B 2201/0208* (2013.01)

(58) Field of Classification Search
CPC  H03B 5/1215; H03B 5/1212; H03B 5/1221; H03B 5/1296
USPC ................ 331/117 R, 117 FE, 167
See application file for complete search history.

(56) References Cited

U.S. PATENT DOCUMENTS

| | | | |
|---|---|---|---|
| 6,765,448 B2 * | 7/2004 | Wu ...................... | H03B 5/1228 331/117 FE |
| 7,362,192 B1 | 4/2008 | Lin et al. | |
| 7,463,106 B2 * | 12/2008 | Shin .................... | H03B 5/1228 331/117 FE |
| 7,884,677 B2 | 2/2011 | Sutardja | |
| 7,940,129 B1 | 5/2011 | Tsang et al. | |
| 8,081,039 B1 | 12/2011 | Venca et al. | |
| 8,098,106 B1 | 1/2012 | Sutardja et al. | |
| 8,149,065 B1 | 4/2012 | Tsang et al. | |
| 8,159,308 B1 | 4/2012 | Sutardja | |
| 8,604,889 B2 * | 12/2013 | Duperray ............ | H03B 5/1278 331/117 FE |
| 8,710,937 B1 | 4/2014 | Sutardja | |
| 8,773,211 B2 * | 7/2014 | Roithmeier ......... | H03B 5/1284 331/117 FE |

OTHER PUBLICATIONS

Andreani et al., "More on the 1/f2 Phase Noise Performance of CMOS Differential-Pair LC-Tank Oscillators", in the IEEE Journal of Solid-State Circuits, vol. 41, No. 12, Dec. 2006, 10 pages.

(Continued)

*Primary Examiner* — Ryan Johnson

(57) ABSTRACT

A voltage-controlled oscillator comprises a tank circuit and first and second pairs of transistors. Each transistor comprises a gate, a drain, and a source. The drains of the first pair are coupled to the tank circuit and the gates of the first pair are cross-coupled with the drains of the first pair. The drains of the second pair are coupled to the tank circuit and the gates of the second pair are cross-coupled with the drains of the second pair. The oscillator includes a first resonant filter comprising a first terminal coupled to the sources of the first pair and a second resonant filter comprising a first terminal coupled to the sources of the second pair. A method includes adjusting capacitance in a resonant filter to cause the resonant filter to resonate based on a selected frequency.

10 Claims, 6 Drawing Sheets

(56) References Cited

OTHER PUBLICATIONS

Brown et al., "A 475 mV, 4.9 GHz Enhanced Swing Differential Colpitts VCO With Phase Noise of—136 dBc/Hz at a 3 MHz Offset Frequency", in the IEEE Journal of Solid-State Circuits, vol. 46, No. 8, Aug. 2011, 14 pages.

Fanori et al., "A 2.5-to-3.3GHz CMOS Class-D VCO", in the IEEE International Solid-State Circuits Conference Digest of Technical Papers, Feb. 20, 2013, 3 pages.

Fanori et al., "A 6.7-to-9.2GHz 55nm CMOS Hybrid Class-B/Class-C Cellular TX VCO", in the 2012 IEEE International Solid-State Circuits Conference Digest of Technical Papers, Feb. 22, 2012, 3 pages.

Gagliolo et al., "Phase Noise Performances of a Cross-Coupled CMOS VCO with Resistor Tail Biasing," in the Proceedings of the 18th Annual ACM Symposium on Integrated Circuits and System Design, Sep. 4, 2005, 5 pages.

Hegazi et al., "A Filtering Technique to Lower LC Oscillator Phase Noise", in the IEEE Journal of Solid-State Circuits, vol. 36, No. 12, Dec. 2001, 10 pages.

Jin et al., "A Transformer-based Filtering Technique to Lower LC-Oscillator Phase Noise", in the IEEE Journal of International Symposium on Circuits and Systems, May 2012, 4 pages.

Liscidini et al., "A 36mW/9mW Power-Scalable DCO in 55nm CMOS for GSM/WCDMA Frequency Synthesizers", in the IEEE International Solid-State Circuits Conference Digest of Technical Papers, Feb. 22, 2012, 3 pages.

Mazzanti et al., "A Push-Pull Class-C CMOS VCO", in the IEEE Journal of Solid-State Circuits, vol. 48, No. 3, Mar. 2013, 9 pages.

Mazzanti et al., "Class-C Harmonic CMOS VCOs, With a General Result on Phase Noise", inthe IEEE Journal of Solid-State Circuits, vol. 43, No. 12, Dec. 2008, 14 pages.

Visweswaran et al., "A Clip-and-Restore Technique for Phase Desensitization in a 1.2V 65 nm CMOS Oscillator for Cellular Mobile Base Stations", in the IEEE International Solid-State Circuits Conference Digest of Techincal Papers, Feb. 22, 2012, 3 pages.

\* cited by examiner

VOLTAGE-CONTROLLED OSCILLATOR

CROSS REFERENCE TO RELATED APPLICATIONS

The present disclosure claims priority to U.S. Patent Application No. 61/929,812, filed on Jan. 21, 2014, which is incorporated herein by reference.

TECHNICAL FIELD

The present disclosure relates to the field of integrated circuits. In particular, the present disclosure relates to low noise voltage-controlled oscillator (VCO) circuits.

BACKGROUND

The background description provided herein is for the purpose of generally presenting the context of the disclosure. Work of one or more of the presently named inventors, to the extent such work is described in this background section, as well as aspects of the description that may not otherwise qualify as prior art at the time of filing, are neither expressly nor impliedly admitted as prior art against the present disclosure.

A voltage-controlled oscillator (VCO) typically includes a resonant circuit element with a switching frequency controlled by other circuit elements, e.g., variable capacitors. VCOs are commonly used in radios or other components for conducting wireless communications. With the industry trend toward lowering hardware and manufacturing costs, radios often employ lower-cost VCOs. However, a disadvantage of this approach is that lower-cost VCOs tend to exhibit phase noise that does not meet the industry's ever-increasing performance requirements of wireless systems. Excess phase noise can reduce bandwidth of a wireless communications channel.

SUMMARY

In various embodiments, the present disclosure provides a voltage-controlled oscillator including a tank circuit and a first pair of transistors. Each transistor includes a gate, a drain, and a source. The drains of the first pair of transistors are coupled to the tank circuit and the gates of the first pair of transistors are cross-coupled with the drains of the first pair of transistors. The oscillator includes a second pair of transistors, each transistor comprising a gate, a drain, and a source. The drains of the second pair of transistors are coupled to the tank circuit and the gates of the second pair of transistors are cross-coupled with the drains of the second pair of transistors. A first resonant filter comprises a first terminal coupled to the sources of the first pair of transistors. A second resonant filter comprises a first terminal coupled to the sources of the second pair of transistors.

In various embodiments, the first resonant filter comprises an inductor and the second resonant filter comprises an inductor and a capacitor.

In various embodiments, the tank circuit, the first resonant filter, and the second resonant filter have respective, substantially equal resonant frequencies.

In various embodiments, the voltage-controlled oscillator comprises a current source coupled to a second terminal of the first resonant filter.

In various embodiments, a filtering capacitor is further coupled to a reference electrode and a second terminal of the second resonant filter is coupled to the reference electrode.

In various embodiments, the transistors of the first pair of transistors are P-channel transistors and the transistors of the second pair of transistors are N-channel transistors.

In various embodiments, the tank circuit comprises an inductor and a capacitor coupled in parallel.

In various embodiments, the capacitor of the tank circuit comprises a variable capacitor.

In various embodiments, the first pair of transistors and the second pair of transistors are interconnected with the tank circuit to define a first and a second current path through the tank circuit in a first direction and a second, different direction, respectively. The first current path corresponds to a first portion of an oscillation cycle of the voltage-controlled oscillator. The second current path corresponds to a second, different portion of the oscillation cycle.

In various embodiments, the first and second resonant filters are configured to permit the transistors of the first transistor pair and the second transistor pair to enter the triode region when the transistors are on.

In various embodiments, a method comprises applying a bias current through a first resonant filter, a circuit including two cross-coupled transistor pairs interconnected with a tank circuit, and a second resonant filter; adjusting a capacitance in the tank circuit to cause the circuit to oscillate at a selected frequency; and adjusting a capacitance in the first resonant filter or the second resonant filter to cause the first resonant filter or the second resonant filter to resonate at substantially twice based on the selected frequency.

In various embodiments, adjusting the capacitance in the first resonant filter or the second resonant filter causes both the first resonant filter and the second resonant filter to resonate at substantially twice the selected frequency.

In various embodiments, applying the bias current includes applying the bias current through one of the two cross-coupled transistor pairs including two P-channel transistors and through the other of the two cross-coupled transistor pairs including two N-channel transistors.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

The present disclosure describes a voltage-controlled oscillator. In one embodiment, resonant filters are used to provide a phase noise and voltage swing within selected ranges. Some embodiments may provide comparable phase noise at reduced voltage swing compared to conventional schemes. In another embodiment, techniques are described for operating a resonant filter and a tank circuit to provide oscillations at a selected frequency with reduced noise.

Figure 1:
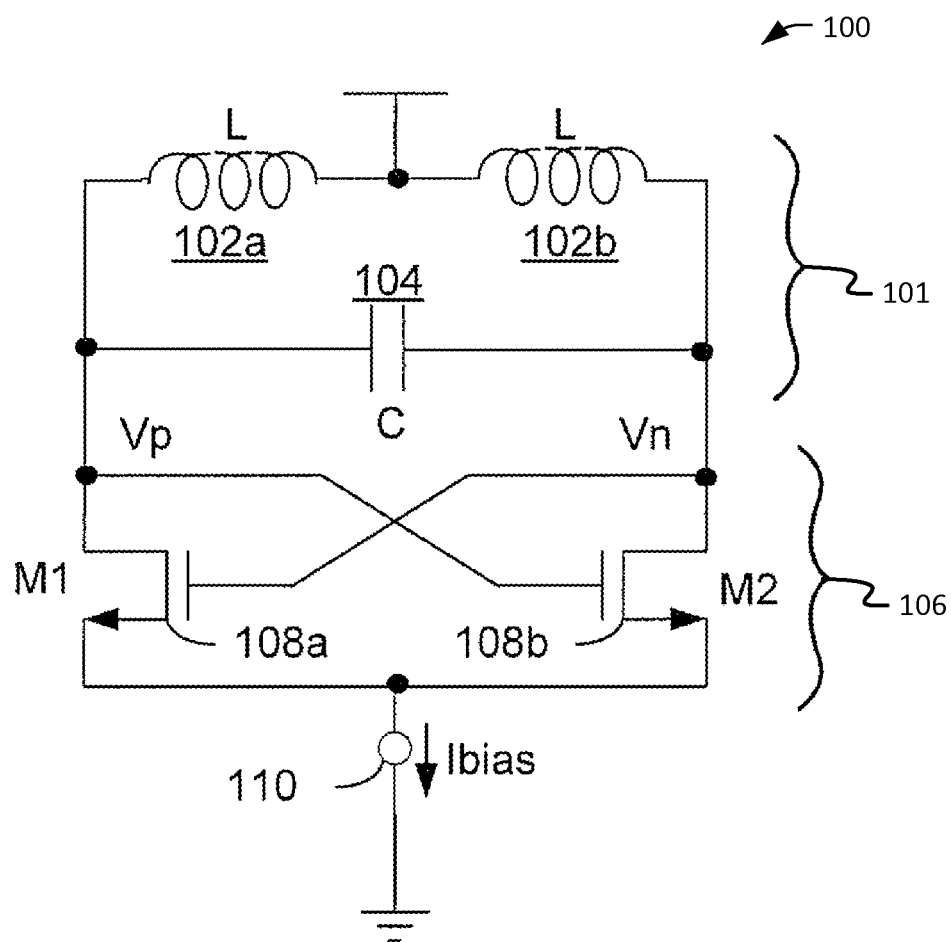
FIG. 1 depicts an example of a voltage-controlled oscillator (VCO) according to various embodiments.

FIG. 1 illustrates various embodiments of a voltage-controlled oscillator 100. An inductor/capacitor (LC) tank 101 is formed by a parallel or series connection of inductors 102a/102b and a capacitor 104. LC tank 101 is coupled to an active circuit, which is represented as a cross-coupled transistor pair 106. As shown, cross-coupled transistor pair 106 is coupled in parallel to LC tank 101 and includes a first transistor 108a (M1) and a second transistor 108b (M2). In this example, transistors 108a, 108b may include N-channel metal-oxide-semiconductor (MOS) field effect transistors (FETs). In an example, inductors 102a, 102b form halves of a center-tapped 380 pH inductor. Transistors 108a, 108b may each have 12 gates of 2.25 µm×0.225 µm.

In operation, for a resonant frequency, the impedance of LC tank 101 becomes effectively infinite and when energy is stored initially in LC tank 101, it circulates from voltage energy in capacitor 104 to current energy in inductors 102, and vice versa. This exchange of energy occurs at the resonant frequency, with the voltage and current being sinusoidal in quadrature phase with respect to each other and the ratio of the voltage and current amplitude being $V/I= \sqrt{L C}$.

Reactive components, such as inductors 102 and capacitor 104, may have losses in any given implementation. The losses may be modeled as series or parallel resistances (not shown) to LC tank 101. The losses may dampen the oscillating signal generated by LC tank 101. The active circuit may be used to compensate for the losses.

A negative resistance is synthesized by cross coupled transistor pair 106 and is explained by describing the currents sourced/sinked by cross-coupled transistor pair 106 to/away from LC tank 101. The current sourced/sinked is biased by a current source 110 producing current "Ibias". Current source 110 may include a current mirror in one example. When a voltage at a node Vp is at its positive peak value, the resistance of LC tank 101 is taking away current from node Vp. This is because the voltage at node Vp is greater than the voltage at node Vn in this condition, so current flows from Vp to Vn through the parasitic resistance across LC tank 101. To compensate for this, transistor 108a sinks less current from node Vp. When the voltage at node Vp is at its negative peak value, the resistance of LC tank 101 is sourcing current into node Vp and transistor 108a is sinking current from node Vp. The dual behavior also happens at node Vn.

Cross-coupled transistor pair 106 is behaving as a negative resistance because cross-coupled transistor pair 106 is sourcing current from nodes Vp or Vn when the voltage is at a maximum at the nodes and sinking current from nodes Vp or Vn when the voltage is at a minimum at the nodes. The ratio between the voltage between nodes Vp and Vn and the current flowing out of nodes Vp or Vn, i.e., the resistance of the cross-coupled transistor pair 106, is negative.

Cross-coupled transistor pair 106 synthesizes the negative resistance that sustains the oscillation at a desired frequency. However, cross-coupled transistor pair 106 introduces noise that contributes to the total phase noise of oscillator 100. This may cause the output of LC tank 101, which is a sine wave, to include some noise. When the sine wave is input from oscillator 100 into a downstream component (not shown; e.g., a frequency divider), this noise may cause jitter on the output of that downstream component. Also, that downstream component may contribute noise as well. The gradual slope of the sine wave increases jitter on the output of the downstream component that is added by the downstream component. This causes uncertainty in when the component may output the signal and may cause problems in operation of a chip.

Figure 2:
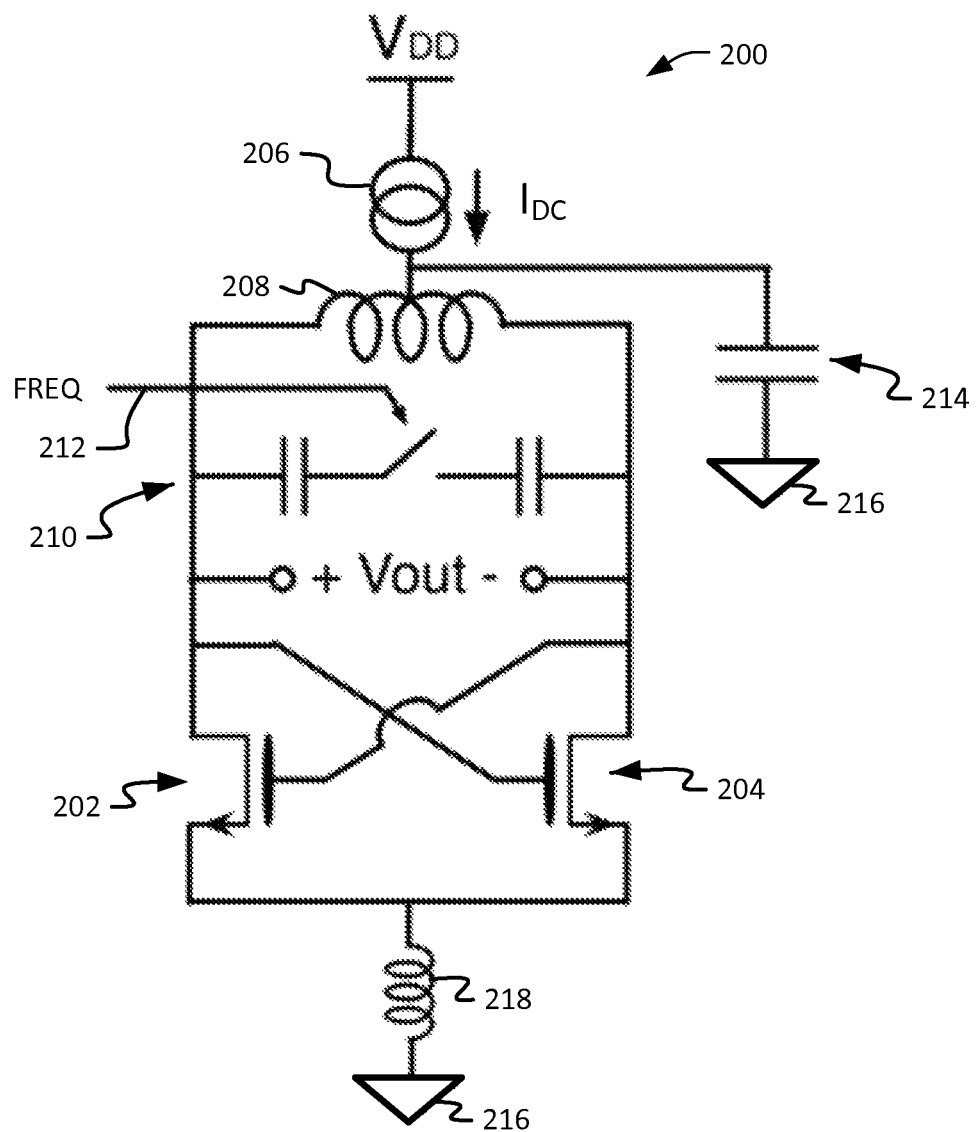
FIG. 2 depicts an example of a VCO according to various embodiments.

FIG. 2 illustrates various embodiments of a VCO 200. VCO 200 has an "N-only" topology, i.e., only uses N-channel transistors 202, 204. The transistors are biased with a current from a current source 206. Cross-coupled transistors 202, 204 are connected across a main tank including inductor 208 and variable capacitance 210. Variable capacitance 210 is controlled by a signal from control input 212. Control input 212 ("FREQ") may control the resonant frequency of the main tank and thus the frequency of VCO 200. Current source 206 supplies current $I_{DC}$ to a center tap of inductor 208. A capacitor 214 bypasses the output of current source 206 to a reference voltage 216, e.g., ground. An inductor 218 is connected between reference voltage 216 and the sources of transistors 202, 204. VCO 200 is thus an example of a class-B oscillator with a tail filter. In an example, inductor 208 may include a center-tapped 380 pH inductor. Transistors 202, 204 may each have 12 gates of 2.25 µm×0.225 µm.

Using the tail filter permits the common source node of transistors 202, 204 to swing below ground. Using the tail filter also permits the switching transistors to enter the triode region of operation (also known as the linear region) without loading the main tank since transistors 202, 204 see a high impedance in series with transistors 202, 204. Using capacitor 214 permits filtering noise of the current source 206 at twice the frequency $\omega_0$ of VCO 200. Increasing the voltage swing in VCO 200 increases power efficiency correspondingly, ultimately reaching a value approaching 90%. However, the voltage swing in VCO 200 is constrained by the supply voltages available to drive VCO 200. In some examples, 90% efficiency would be achieved at a voltage swing close to three times the supply voltage. Many integrated-circuit technologies have difficulty operating at those high multiples of the supply voltage.

Voltage-Controlled Oscillator Construction and Operation

Figure 3:
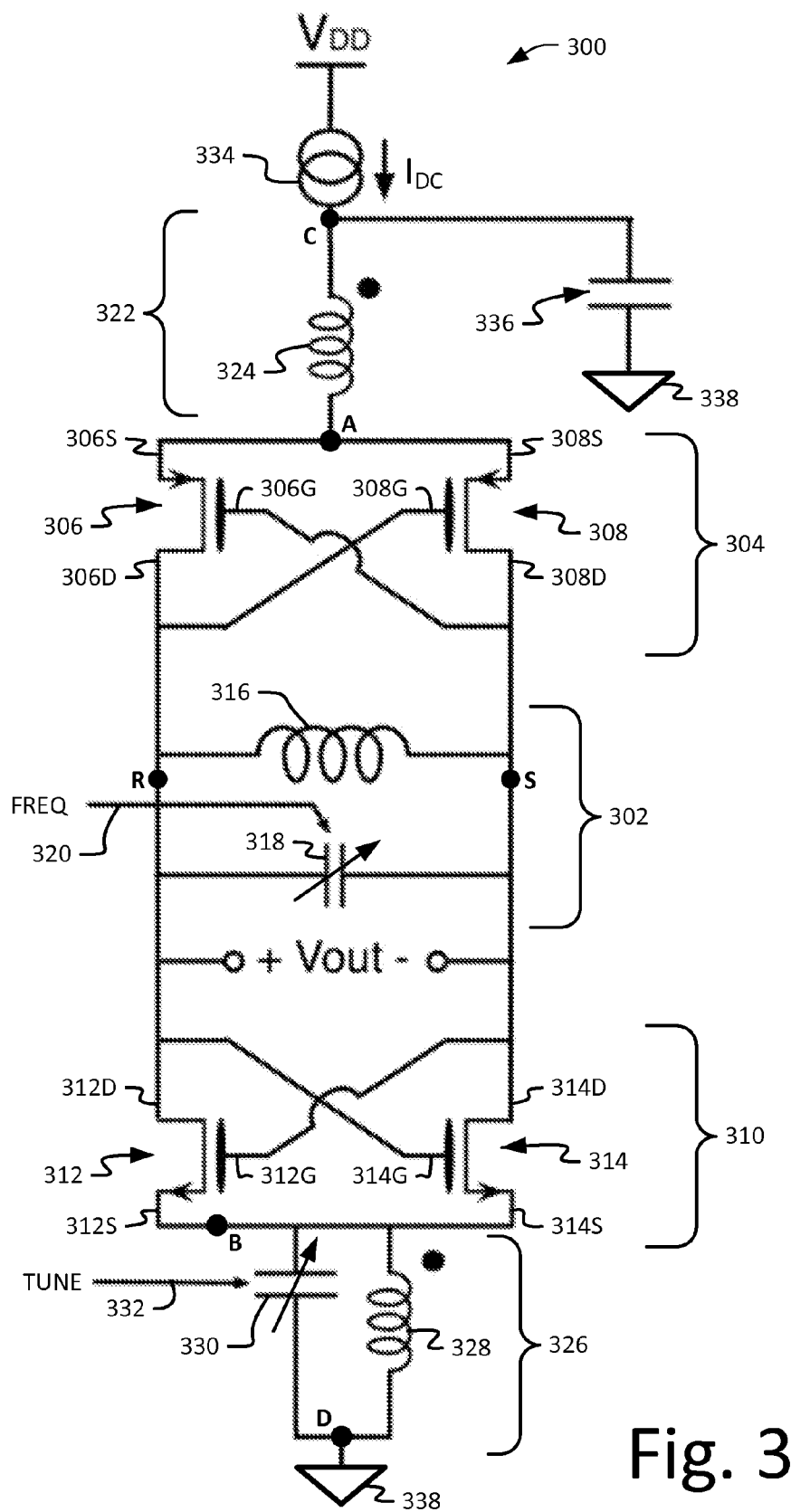
FIG. 3 depicts an example of a VCO according to various embodiments.

FIG. 3 depicts an example of a voltage-controlled oscillator (VCO) 300 according to one embodiment. Voltage-controlled oscillator 300 includes a main tank 302, in this example an inductor-capacitor (LC) tank circuit. VCO 300 also includes a first pair 304 of transistors 306, 308 and a second pair 310 of transistors 312, 314. Each transistor comprises a gate (306G, 308G, 312G, 314G, respectively), a drain (306D, 308D, 312D, 314D, respectively), and a source (306S, 308S, 312S, 314S, respectively). Drains 306D, 308D of first pair 304 of transistors are coupled to main tank 302 and gates 306G, 308G of first pair 304 of transistors are cross-coupled with drains 306D, 308D of first pair 304 of transistors. Drains 312D, 314D of second pair 310 of transistors are coupled to main tank 302 and gates 312G, 314G of second pair 310 of transistors are cross-coupled with drains 312D, 314D of second pair 310 of transistors.

Transistors 306, 308, 312, 314 may be N-channel metal-oxide-semiconductor field-effect transistors (N-channel MOSFETs or "NFETs") but may also be implemented using other components, such as P-channel MOSFETs ("PFETs"). N-channel transistors may use electrons as their charge carriers, and P-channel transistors may use holes as their charge carriers. Each cross-coupled transistor pair 304, 310 provides a negative resistance by sourcing/sinking current into/out of main tank 302. In the example shown, transistors 306, 308 of first pair 304 of transistors are P-channel transistors, and transistors 312, 314 of second pair 310 of transistors are N-channel transistors. In some examples, each transistor 306, 308 may have 50 gates of 1.2 μm×0.2 μm each. In some examples, each transistor 312, 314 may have 50 gates of 0.8 μm×0.2 μm each.

Main tank 302, in the illustrated example, includes inductor 316 and capacitor 318 coupled in parallel. In some examples, capacitor 318 may include multiple capacitors coupled through a common node, e.g., GND. In some examples, capacitor 318 of main tank 302 is a variable capacitor, e.g., an adjustable or tunable capacitor, controlled by a signal from control input 320. Control input 320 ("FREQ") may control the resonant frequency of main tank 302 and thus the frequency of VCO 300. Specifically, in some examples, VCO 300 has main tank 302 with two terminals R and S, and includes variable capacitor 318.

VCO 300 includes a first resonant filter 322 comprising a first terminal A coupled to sources 306S, 308S of first pair 304 of transistors. In the illustrated example, filter 322 includes inductor 324. In other examples, filter 322 also includes a capacitor (not shown), e.g., a variable capacitor.

VCO 300 also includes a second resonant filter 326 comprising a first terminal B coupled to sources 312S, 314S of second pair 310 of transistors. In the illustrated example, filter 326 includes inductor 328 and capacitor 330. VCO 300 is an example of a class-B oscillator. Resonant filters 322, 326 may include respective LC tanks or components thereof.

In the illustrated example, inductors 324, 328 are magnetically coupled. In some examples, inductors 324, 328 are arranged as coils of a transformer. Inductors 324, 328 may, e.g., be nested inside each other, or wound on or around a common core or air gap.

Capacitor 330 in filter 326 may be a variable capacitor, as shown, controlled by a signal from control input 332. Control input 332 ("TUNE") may control the resonant frequency of resonant filter 326. In examples in which inductors 324, 328 are magnetically coupled, control input 332 may control the resonant frequencies of both filters 322, 326. In at least one example, inductors 324, 328 are magnetically coupled, and are sized, configured, and arranged with respect to capacitor 330 so that filters 322, 326 have respective, substantially equal resonant frequencies.

In the example shown, a current source 334 is used to provide a bias current $I_{DC}$ from or to a supply voltage $V_{DD}$. Current source 334 is coupled to a terminal C of first resonant filter 322. A filtering capacitor 336, e.g., a bypass capacitor, may be coupled to terminal C and configured to filter high frequency noise of current source 334. In the example shown, filtering capacitor 336 is further coupled to a reference electrode 338. In the example shown, reference electrode 338 is a ground electrode. A terminal D of second resonant filter 326 is also coupled to reference electrode 338. Current through current source 334 may flow from $V_{DD}$ towards reference electrode 338, defining a "sourcing" configuration, or towards $V_{DD}$ from reference electrode 338, defining a "sinking" configuration.

In some examples, the first and second resonant filters 322, 326 are configured to permit each transistor 306, 308 of the first transistor pair 304 and each transistor 312, 314 of the second transistor pair 310 to enter the triode region of operation without loading the main tank 302. In some examples, filter 324 provides a high impedance in series with transistors 306, 308 and filter 326 provides a high impedance in series with transistors 312, 314.

In some examples, the first transistor pair 304 and the second transistor pair 310 are interconnected with the main tank 302 to define a first current path along which current flows through main tank 302 in a first direction during a first portion of an oscillation cycle of the voltage-controlled oscillator, and to define a second current path along which current flows through the main tank 302 in a second, different direction during a second, different portion of the oscillation cycle. For example, transistors 306, 308 may be PFETs and transistors 312, 314 may be NFETs. During a first portion of the oscillation cycle, transistors 306, 314 may be conducting and transistors 308, 312 may be substantially in cutoff. The voltage $V_R$ at terminal R may be greater than the voltage $V_S$ at terminal S. Current may flow through main tank 302 from terminal R to terminal S, i.e., in the first direction. During a second portion of the oscillation cycle, transistors 308, 312 may be conducting and transistors 306, 314 may be substantially in cutoff, with $V_R<V_S$. Current may flow through main tank 302 from terminal S to terminal R, i.e., in the second direction. In some examples, substantially away from a zero crossing of a voltage waveform of the main tank, only one transistor in the first pair of transistors 304 is conducting and only one transistor in the second pair 310 of transistors is conducting, neglecting leakage.

Figure 4:
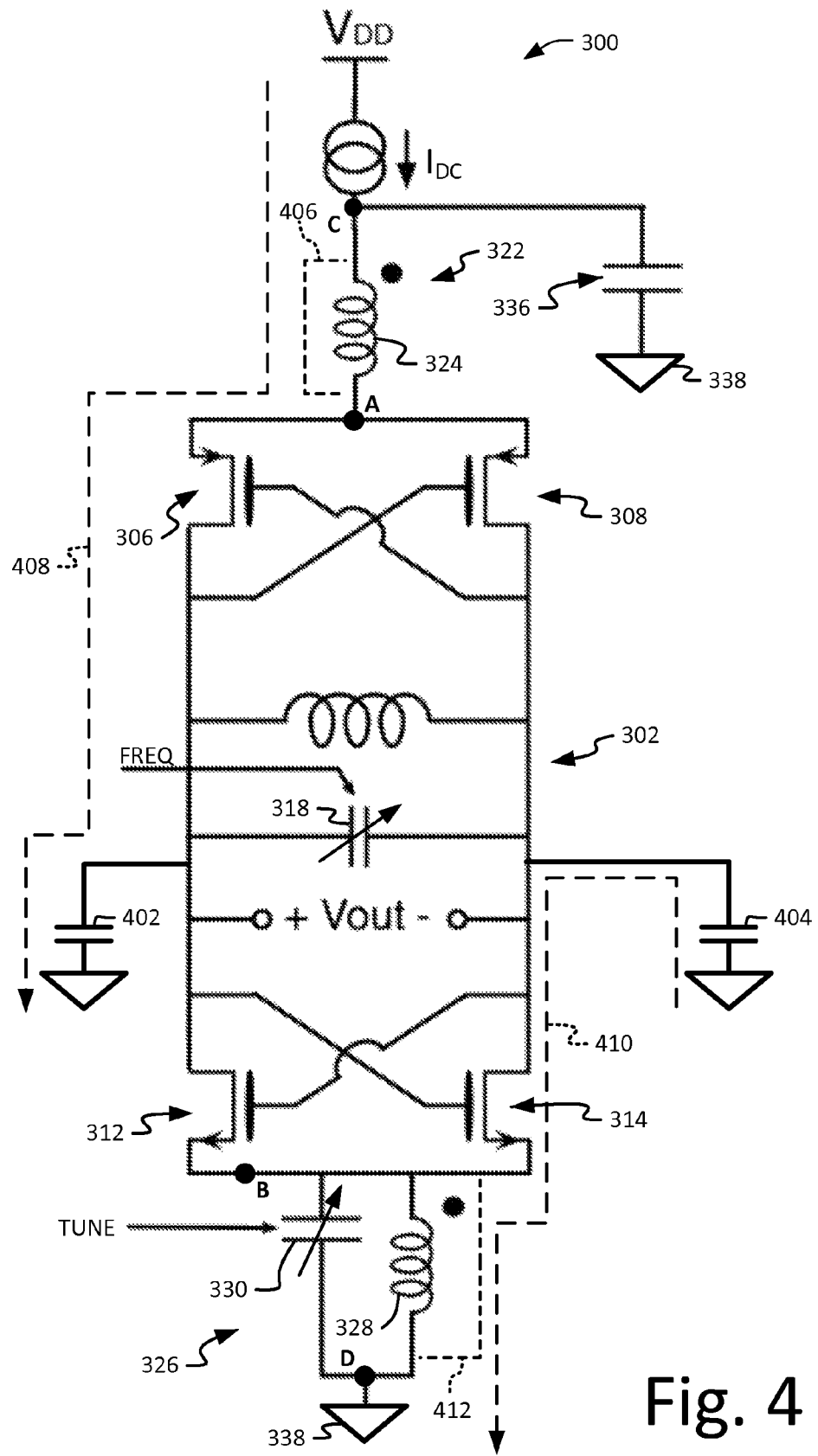
FIG. 4 depicts an example of a VCO according to various embodiments.

FIG. 4 depicts an example of current flow paths in inventive VCO 300. For brevity, some component labels are omitted. In addition to tank capacitor 318, FIG. 4 shows parasitic capacitors 402, 404. Parasitic capacitors 402, 404 may represent capacitance, e.g., between the drains and body contacts or between the gates and drains of transistors 306, 308, 312, or 314. Parasitic capacitors 402, 404 may represent, e.g., capacitance to ground arising because capacitors in main tank 302, e.g., capacitor 318, may be implemented as an array that is not completely differential.

Transistors 306, 308, e.g., PFETs, produce noise during operation. Transistors 312, 314, e.g., NFETs, also produce noise during operation. The noise may include shot noise, Johnson noise, or other fluctuations in current through or voltage drop across the channels of transistors 306, 308, e.g., between source 306S and drain 306D. The noise may include leakage current between one or more of terminals 306G, 306S, 306D. VCO 300 operates at a particular frequency, denoted $\omega_0$; noise at frequencies near $\omega_0$ can appear as phase noise and reduce the performance of VCO 300.

Odd harmonics of $\omega_0$, e.g., $3\omega_0$ or $5\omega_0$, generally circulate within main tank 302 and so can be cancelled out as common-mode noise. However, in the presence of parasitic capacitors, if there is a connection 406 between nodes A and C, even harmonics of $\omega_0$ can flow from transistors 306, 308 along path 408 through connection 406 and capacitor 402 to ground. Similarly, even harmonics of $\omega_0$ can flow through capacitor 404 and transistors 312, 314 along path 410 to ground if there is a connection 412 between nodes B and D. Flow along either path 408 or path 410 can add differential-mode noise to the circuit, increasing the phase noise and decreasing performance.

High even harmonics of $\omega_0$, e.g., the fourth harmonic and above, may have low enough magnitude that they are not significant contributors to the overall noise. Accordingly, the discussion below focuses on filtering out noise at the second harmonic, $2\omega_0$. However, noise can be filtered at any harmonic, even or odd, by adjusting component values appropriately.

In order to reduce the effect of FET noise, inductor 324 of filter 322 is arranged along path 408. Inductor 328 of filter 326 is arranged along path 410. These inductors are arranged in parallel with capacitors, e.g., capacitor 330, to form bandstop filters. In the illustrated example, inductors 324, 328 are magnetically coupled. Accordingly, the capacitance of capacitor 330 and the inductance of inductor 324 are selected so that filter 322 resonates, and has high impedance at, $2\omega_0$. Filter 322 thus breaks connection 406 by attenuating signals, e.g., at $2\omega_0$. The inductance of inductor 328 is similarly selected so that filter 326 will resonate at $2\omega_0$ given the selected value of capacitor 330. Filter 326 breaks connection 412 by attenuating signals, e.g., at $2\omega_0$. In examples using magnetically-independent inductors, each filter 322, 326 can be individually tuned to $2\omega w_0$.

To reduce the area overhead associated with the two $2\omega_0$ filters 322, 326, inductors 324, 328 may be magnetically coupled, as noted above. In some examples implementing filters 322, 326 using, e.g., semiconductor integrated circuits, inductors 324, 328 may be laid out inside each other. The two coupled resonators may have the same resonance frequency and may be tunable using a single capacitor bank.

A simulation was performed of a VCO similar to the illustrated VCO 300, but omitting inductor 324, i.e., with connection 406 present. In the simulation, the noise of the P-channel transistors 306, 308 was ~40% of the total noise at the lower end of a simulated tuning range. A simulation was performed using both filters 322, 326. In that simulation, the PFET noise was smaller, about 21% of the total noise, and significantly constant over the simulated tuning range. In both simulations the noise of the N-channel transistors 312, 314 was about 23% of the total noise. In the simulation conditions, using filters 322, 326 resonant at $2\omega_0$ reduced phase noise by ~1.8 dB.

Voltage-Controlled Oscillator Integration and Control

Figure 5:
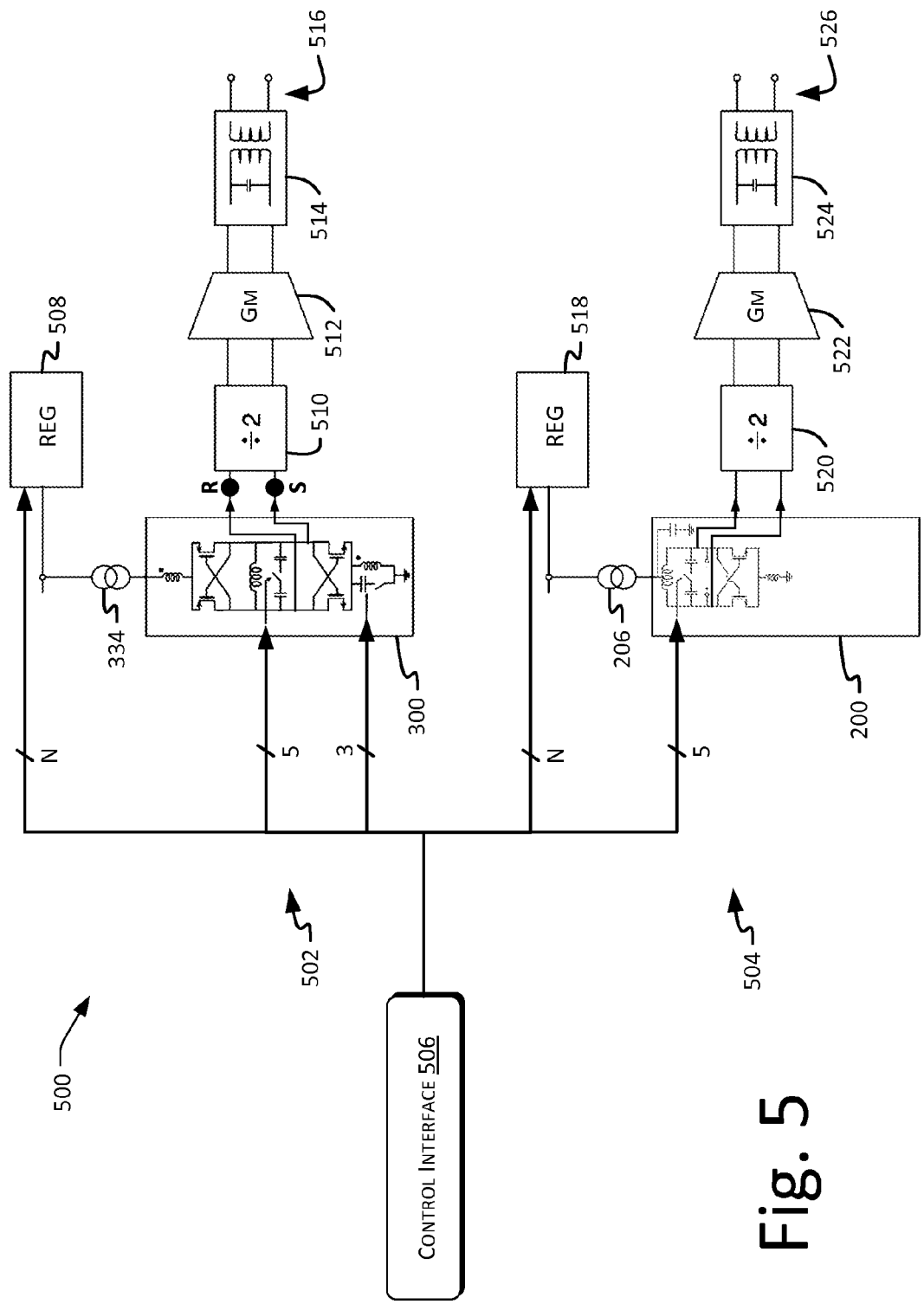
FIG. 5 depicts an example of a dual-VCO circuit according to various embodiments.

FIG. 5 shows a partial schematic of a circuit 500 including a P-N oscillator 502 having VCO 300, and including an N-only oscillator 504 including VCO 200. VCOs 300, 200 may be controlled via control interface 506, in a tested example an I²C bus.

Oscillator 502 includes register 508, the value of which is set via control interface 506. That value controls the amount of current through current source 334 for amplitude tuning. As shown, VCO 300 also includes a five-bit bus (FREQ, FIG. 3) to control the tuning range by adjusting the variable capacitors and a three-bit bus (TUNE, FIG. 3) to control the tuning of the tail tank. Other bus widths, topologies, or types may be used, e.g., serial or parallel busses.

The outputs of VCO 300 are connected to frequency divider 510 of oscillator 502. In this example, frequency divider 510 divides the frequency by two. Other divisors can be used. The divided signal passes through transconductance amplifier 512, a voltage-to-current converter, and then the resulting current passes into resonant buffer 514 to form outputs 516.

Oscillator 504 includes register 518, the value of which is set via control interface 506. That value controls the amount of current through current source 206 for amplitude tuning. As shown, VCO 200 also includes a five-bit bus (FREQ, FIG. 2) to control the tuning range by adjusting the variable capacitors.

The outputs of VCO 200 are connected to frequency divider 520 of oscillator 502. In this example, frequency divider 520 divides the frequency of its input by two to provide its output. Other divisors can be used. The divided-frequency signal passes through transconductance amplifier 522, a voltage-to-current converter, and then the resulting current passes into resonant buffer 524 to form outputs 526. In some examples, oscillators 502, 504 may be constructed using thick oxide devices having a 1.8 V maximum voltage and may be biased at 1.5 V from a band-gap-referenced on-chip low-voltage-drop regulator. In some examples, oscillators 502, 504 can be designed with substantially identical tanks, barring process variation. In some examples, oscillators 502, 504 may be designed to support a tuning range from 7.2 gigahertz (GHz) to 8.3 GHz before the frequency division by 2 performed by frequency dividers 510, 520.

Still referring to FIG. 5, a 5-bit metal-oxide-metal (MOM) capacitor bank may be used for tunable tank capacitors 318, 210. The tail tanks, including first resonant filter 322 having inductor 324 and second resonant filter 326 having inductor 328, may be designed to provide a high impedance at $2\omega_0$ to reduce loading on the main tanks, e.g., main tank 302. High impedance designs can include a high quality factor (Q) or a high inductance value. Q is correlated with filter selectivity. Tail tanks may use a low inductance with a high Q to permit using very large devices in the negative resistance, reducing DC voltage drops across transistors 306, 308, 312, 314. An additional capacitor array may be used for the tuning of the tail tanks to $2\omega_0$.

For example, the tail tanks of P-N oscillator 502 may be designed with inductance values of inductors 324, 328 of 180 pH and 130 pH and a coupling factor of 0.7, and a Q of about 12. Capacitor 330 of filter 326 in P-N oscillator 502 may include a 3-bit capacitor bank controlled independently from the capacitance of the main tank for tuning both tail tanks. For the N-only oscillator 504, the single tail tank may have a quality factor of about 5 and use 300 pH inductor 218. The Q of oscillators 502, 504 may be determined experimentally by measuring both the minimum supply current needed to startup oscillations and the maximum absorbed current for a given supply voltage. Fitting the measured number with simulation may result in an estimated Q. For example, each oscillator 502, 504 may have a Q between 14 and 15.

Specifically, in some examples, VCO 300 includes current source 334 coupled to second terminal C of first resonant filter 322. Control interface 506 is configured to control a current of the current source 334, a capacitance of the variable capacitor 318 of the main tank 302, and a capacitance of the variable capacitor 330 of the second resonant filter 326. Frequency divider 510 in some examples is coupled to the two terminals R, S of the main tank 302, e.g., as shown.

Phase noise may be expressed in decibels-relative-to-carrier per hertz (dBc/Hz), as a function of frequency offset from the carrier in megahertz (MHz), after divider 510. In some examples, the frequency after the divider is 3.64 GHz, 3.7 GHz, 4.15 GHz, or 4.2 GHz.

Figure of merit (FoM) is phase noise normalized to frequency of oscillation, offset frequency from the carrier and power consumption. Higher FoM values indicate better performance. For LC oscillators in which the energy restoring circuit drives the tank with a high impedance, for a particular Q of the tank, the FoM is directly correlated with the oscillator power efficiency. Power efficiency is one half of the product of current efficiency and voltage efficiency. Current efficiency is the ratio between the peak tank current at the fundamental frequency and the supply current. Voltage efficiency is the ratio between the peak tank voltage at the fundamental frequency and the supply voltage. In class B oscillators such as that shown in FIG. 3, peak power efficiency corresponds to peak FoM. This is because, as the voltage swing is increased, both current efficiency and noise remain constant, even when the switching transistors are pushed deeply into the linear (triode) region. Compared to the N-only VCO 200, FIG. 2, the P-N VCO 300, FIG. 3, may achieve the same power efficiency (the same peak FoM) with half the voltage swing across the switching transistors. This may increase the operating range of the device and reduce the probability of overvoltage.

Since FoM may vary with Q, excess noise factor (ENF) may be computed and used to compare performance of different oscillators in a way that is independent of Q. ENF is defined as:

$$ENF = FoM_{max} - FoM \qquad (1)$$

and lower values are preferred. $FoM_{max}$ is defined as:

$$FoM_{max} = -10\log\frac{kT}{2\times10^{-3}Q^2} \qquad (2)$$

and represents a theoretical maximum FoM for an oscillator of a particular Q operating at a particular temperature T, with a noise factor F=1 and 100% power efficiency. ENF represents how closely the FoM of a given oscillator approaches $FoM_{max}$. FoM and $FoM_{max}$ are expressed in dBc/Hz; ENF is expressed in dB. In some examples, oscillators described herein may provide improved FoM or ENF without large increases in the required supply voltage range. Some oscillators herein may be used with 1.5 V complementary metal-oxide-semiconductor (CMOS) systems.

Figure 6:
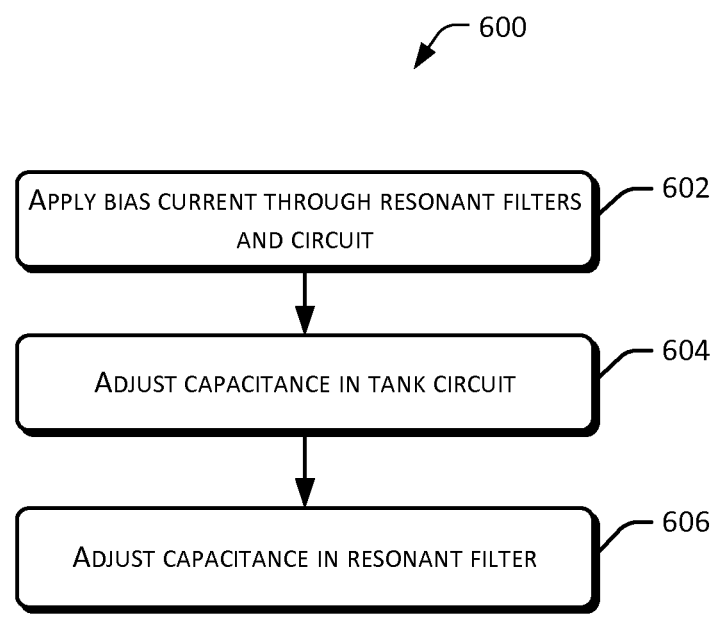
FIG. 6 is a diagram illustrating a method for operating a VCO according to various embodiments.

FIG. 6 illustrates an example method 600 of operating a VCO. As an example, VCO 300, illustrated in FIG. 3, may be operated. The steps can be performed in any order except when otherwise specified. For clarity of explanation, reference is herein made to various components shown in FIG. 3 that can carry out or participate in the steps of the example method. It should be noted, however, that other components can be used; that is, example method(s) shown in FIG. 6 are not limited to being carried out by the identified components. Similarly, components specifically identified below may be used in other configurations than that in which they are illustrated herein, or with other devices or structures, whether or not shown herein.

At 602, a bias current $I_{DC}$ is applied through first resonant filter 322, a circuit including two cross-coupled transistor pairs 304, 310 interconnected with a main tank 302, and second resonant filter 326. In some examples, 602 includes applying the bias current $I_{DC}$ through one transistor pair 304 of the two cross-coupled transistor pairs including two P-channel transistors 306, 308 and through the other transistor pair 310 of the two cross-coupled transistor pairs including two N-channel transistors 312, 314.

At 604, a capacitance in main tank 302 is adjusted to cause the circuit to oscillate at a selected frequency, specifically to experience electrical oscillations of current or voltage at the selected frequency.

At 606, a capacitance in first resonant filter 322 or second resonant filter 326 is adjusted to cause first resonant filter 322 or second resonant filter 326 to resonate based on the selected frequency, e.g., at substantially twice the selected frequency or at another multiple or fraction of the selected frequency. In some examples, resonating at substantially twice the selected frequency due to This adjustment permits first resonant filter 322 or second resonant filter 326 to attenuate second-harmonic content that might otherwise increase phase noise. In some examples, adjusting the capacitance in first resonant filter 322 or second resonant filter 326 causes both the first resonant filter 322 and second resonant filter 326 to resonate at substantially twice the selected frequency or at another multiple or fraction of the selected frequency.

Note that the description above incorporates use of the phrases "in an aspect," "in an embodiment," or "in various embodiments," or the like, which may each refer to one or more of the same or different embodiments. Furthermore, the terms "comprising," "including," "having," and the like, as used with respect to embodiments of the present disclosure, are synonymous.

As used herein, the terms "logic," "unit," "component," and "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. The logic and functionality described herein may be implemented by any such components.

In accordance with various embodiments, an article of manufacture may be provided that includes a storage medium having instructions stored thereon that, if executed, result in the operations described above. In an embodiment, the storage medium comprises some type of non-transitory memory (not shown). In accordance with various embodiments, the article of manufacture may be a computer-readable medium such as, for example, software or firmware.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although the present disclosure describes embodiments having specific structural features and/or methodological acts, it is to be understood that the claims are not necessarily limited to the specific features or acts described.

What is claimed is:

1. A voltage-controlled oscillator comprising:
    a tank circuit;
    a first pair of transistors, wherein each transistor of the first pair of transistors comprises a gate, a drain, and a source, and wherein the drains of the first pair of transistors are coupled to the tank circuit and the gates of the first pair of transistors are cross-coupled with the drains of the first pair of transistors;
    a second pair of transistors, wherein each transistor of the second pair of transistors comprises a gate, a drain, and a source, and wherein the drains of the second pair of transistors are coupled to the tank circuit and the gates of the second pair of transistors are cross-coupled with the drains of the second pair of transistors;
    a first resonant filter comprising a first inductor, wherein a first terminal of the first inductor is coupled to the sources of the first pair of transistors, and wherein the first resonant filter does not include a capacitor coupled in parallel to the first inductor;
    a second resonant filter comprising (i) a second inductor and (ii) a capacitor bank coupled in parallel to the second inductor,
        wherein the first inductor of the first resonant filter and the second inductor of the second resonant filter are magnetically coupled,
        wherein the capacitor bank of the second resonant filter is configured to be used to tune each of the first resonant filter and the second resonant filter, based on the first inductor of the first resonant filter and the second inductor of the second resonant filter being magnetically coupled, wherein a first terminal of the second inductor is coupled to the sources of the second pair of transistors; and a current source having a first terminal coupled to a second terminal of the first inductor.

2. The voltage-controlled oscillator of claim 1, wherein the first inductor of the first resonant filter and the second inductor of the second resonant filter are arranged as coils of a transformer.

3. The voltage-controlled oscillator of claim 1, wherein the capacitor bank comprises a variable capacitor.

4. The voltage-controlled oscillator of claim 1, wherein the tank circuit comprises two terminals and a first capacitor, and wherein the voltage-controlled oscillator further comprises:

a control interface configured to control a current of the current source, a capacitance of the first capacitor of the tank circuit, and a capacitance of the capacitor bank of the second resonant filter; and a frequency divider coupled to the two terminals of the tank circuit.

5. The voltage-controlled oscillator of claim 1, wherein:

the transistors of the first pair of transistors are P-channel transistors; and the transistors of the second pair of transistors are N-channel transistors.

6. The voltage-controlled oscillator of claim 1, further comprising:

a first capacitor coupled between (i) the first terminal of the current source and (ii) a second terminal of the second inductor of the second resonant filter.

7. The voltage-controlled oscillator of claim 1, wherein the tank circuit comprises a third inductor and a capacitor coupled in parallel.

8. The voltage-controlled oscillator of claim 7, wherein the capacitor of the tank circuit comprises a variable capacitor.

9. The voltage-controlled oscillator of claim 1, wherein the first pair of transistors and the second pair of transistors are interconnected with the tank circuit to define a first current path through the tank circuit in a first direction, the first current path corresponding to a first portion of an oscillation cycle of the voltage-controlled oscillator, and to define a second current path through the tank circuit in a second, different direction, the second current path corresponding to a second, different portion of the oscillation cycle.

10. The voltage-controlled oscillator of claim 1, wherein the first and second resonant filters are configured to permit the transistors of the first transistor pair and the second transistor pair to enter the triode region when the transistors are on.

* * * * *